(12) United States Patent
Sherstinsky et al.

(10) Patent No.: US 6,350,320 B1
(45) Date of Patent: Feb. 26, 2002

(54) HEATER FOR PROCESSING CHAMBER

(75) Inventors: Semyon Sherstinsky, San Francisco; Alison Gilliam, Fremont; Paul Smith; Leonel A. Zuniga, both of San Jose; Ted Yoshidome, Oakland; Nitin Khurana, Milpitas; Rod Mosely, Pleasanton; Umesh Madhav Kelkar, Sunnyvale; Joseph Yudovsky, Campbell; Alan Popiolkowski, Los Banos, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/510,110

(22) Filed: Feb. 22, 2000

(51) Int. Cl.[7] ........................... C23C 16/00; C23C 14/00
(52) U.S. Cl. ..................... 118/715; 118/728; 118/500; 204/298.07; 204/298.11; 204/298.15; 427/248.1
(58) Field of Search ................................. 118/715, 728, 118/729, 730, 500; 204/298.07, 298.11, 298.15; 427/248.1

(56) References Cited

U.S. PATENT DOCUMENTS

| | | | | |
|---|---|---|---|---|
| 5,326,725 A | * | 7/1994 | Sherstinsky et al. | 437/255 |
| 5,516,367 A | * | 5/1996 | Lei et al. | 118/725 |
| 5,556,476 A | * | 9/1996 | Lei et al. | 118/728 |
| 5,578,532 A | * | 11/1996 | van de Ven et al. | 437/245 |
| 5,620,525 A | * | 4/1997 | van de Ven et al. | 118/728 |
| 5,766,365 A | * | 6/1998 | Umotoy et al. | 118/728 |
| 5,843,233 A | * | 12/1998 | van de Ven et al. | 118/715 |
| 5,882,419 A | * | 3/1999 | Sinha et al. | 118/729 |
| 5,888,304 A | * | 3/1999 | Umotoy et al. | 118/720 |
| 5,985,033 A | | 11/1999 | Yudovksy et al. | 118/715 |
| 6,033,480 A | * | 3/2000 | Chen et al. | 118/715 |
| 6,040,011 A | | 3/2000 | Yudovsky et al. | 427/255.28 |
| 6,051,122 A | * | 4/2000 | Flanigan | 204/298.11 |
| 6,096,135 A | * | 8/2000 | Guo et al. | 118/729 |
| 6,210,486 B1 | * | 4/2001 | Mizukami et al. | 118/728 |
| 6,224,472 B1 | * | 5/2001 | Lai et al. | 451/398 |
| 6,248,176 B1 | * | 6/2001 | Yudovsky et al. | 118/715 |

OTHER PUBLICATIONS

U.S. application No. 08/893,858, Sherstinsky et al., "WCVD Heater with Improved Contact Surface", filed Jul. 11, 1997.
U.S. application No. 09/527,090, Sherstinsky et al., "Shadow Ring with Common Guide Member", filed Mar. 16, 2000.
U.S. application No. 60/135,293, Sherstinsky et al., "300 WXZ Gas Distribution Channel", filed May 21, 1999.

* cited by examiner

Primary Examiner—Jeffrie R. Lund
(74) Attorney, Agent, or Firm—Moser, Patterson & Sheridan LLP

(57) ABSTRACT

A gas delivery apparatus and method for directing a flow of gas to the edge of a substrate at an angle to the radial direction of the substrate is provided. The apparatus directs the gas from a gas opening, over a plurality of grooves that are angled relative to a radial line originating at a center of the gas delivery apparatus. Subsequently, the gas is flowed over a portion of the substrate to prevent reactive gases from depositing on selective portions of the substrate.

28 Claims, 7 Drawing Sheets

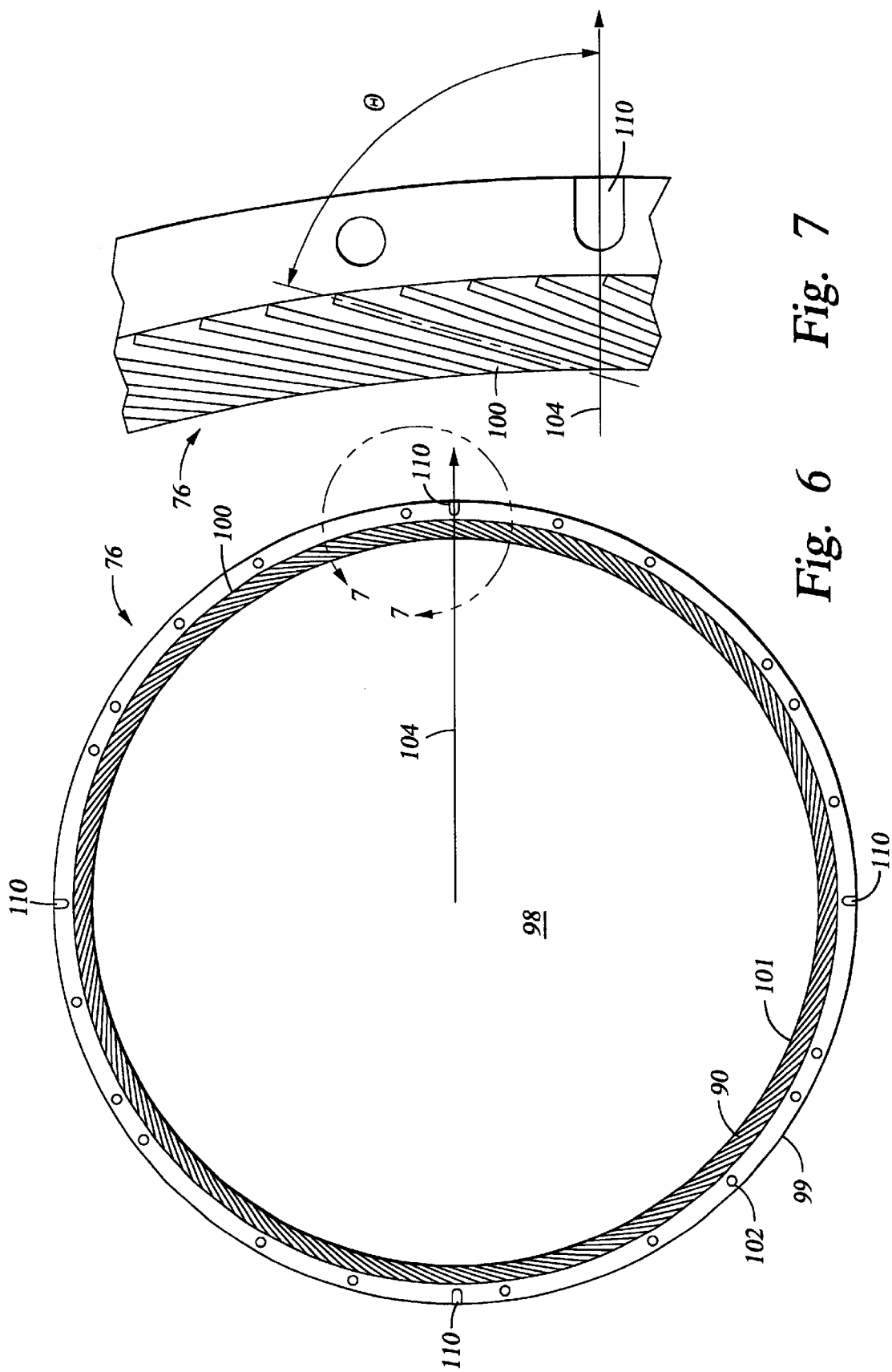

HEATER FOR PROCESSING CHAMBER

BACKGROUND OF THE INVENTION

1. Field of the Invention

The invention relates to the field of semiconductor substrate processing equipment. More particularly, the invention relates to an apparatus and method for supporting a substrate during processing.

2. Background of the Related Art

In the fabrication of integrated circuits, equipment has been developed to automate substrate processing by performing several sequences of processing steps without removing the substrate from a vacuum environment, thereby reducing transfer times and contamination of substrates. Such a system has been disclosed, for example, by Maydan et al., U.S. Pat. No. 4,951,601, in which a plurality of processing chambers are connected to a transfer chamber. A robot in a central transfer chamber passes substrates through slit valves into the various connected processing chambers and retrieves them from the chambers after processing is complete.

The processing steps carried out in the vacuum chambers typically require the deposition or etching of multiple metal, dielectric and semiconductor layers on the surface of a substrate. Examples of such processes include chemical vapor deposition (CVD), physical vapor deposition (PVD), and etching processes.

Vacuum chambers are employed in CVD to deposit thin films on semiconductor substrates. Typically, a precursor gas is charged into a vacuum chamber through a gas manifold plate situated above the substrate. In a thermal process the substrate is typically heated to a desired process temperature. The precursor gas charged into the chamber reacts on the heated substrate surface to deposit a thin layer thereon.

Challenges encountered in CVD include material deposition on the edge and back side of the substrate and on the support member. Deposition on the edge and backside of a substrate, for example, can potentially render a substrate incompatible for subsequent processes, such as chemical mechanical polishing (CMP). Material deposited on the edge of the substrate can remain on the edge after CMP and potentially create a particle source or jeopardize the integrity of the device formed by the process. Additionally, material on the edge and backside of a substrate may delaminate and similarly become a particle source. Still further, material deposited on the substrate and support member may cause the substrate to adhere to the support member and may compromise the integrity of the devices formed on the substrate.

In order to mitigate the problems of unwanted deposition on the substrate and the support member, shadow rings and purge gas have come into use. Shadow rings cover the periphery of the substrate during deposition to mask the edge of the substrate to inhibit the deposition gases from contacting the edge and backside of the substrate. However, due to the volatility of some precursor gases, such as $WF_6$, for example, shadow rings alone do not prevent edge and backside deposition on the substrate.

Purge gas directed behind or at the edge of the substrate has been used to prevent edge and backside deposition. The purge gas exerts a positive pressure near a perimeter portion of the substrate that reduces the likelihood that processing gas will reach the edge and backside of the substrate as well as the support member holding the substrate. In systems using a purge gas, a plurality of spaced purge gas orifices formed in the support member deliver the purge gas to the edge of the substrate. However, conventional purge gas systems can result in non-uniform deposition of the material over the surface of the substrate intended to be coated.

As the desire for greater throughput and efficiency in semiconductor device fabrication has increased, integrated circuit manufacturer requirements governing the thickness and uniformity of the deposited film at the substrate edge have become more stringent. Current industry standards demand no film deposition on the beveled edge of the substrate and a film thickness at a point 3 mm from the edge of the substrate that is 90 percent or more of the film thickness at the center of the substrate with a thickness uniformity better than ±5 percent, excluding the area within 3mm from the substrate edge (known as the "exclusionary zone").

Therefore, there is a need for a system and method which prevents back side deposition and meets the edge exclusion demands of the industry while not affecting deposition uniformity across the surface of the substrate.

SUMMARY OF THE INVENTION

Generally, embodiments of the present invention include apparatus and methods for delivering a gas to the edge of a substrate disposed on a substrate support member. More specifically, the present invention provides a gas delivery apparatus that directs a purge gas to the edge of a substrate at an angle relative to a radial line originating at a center of a deflection member disposed near the substrate.

In one aspect of the invention, an angle of gas flow is controlled by flowing the gas through grooves or other gas deflection structures formed in a gas delivery apparatus. The gas is flowed into an annular opening which provides a fluid passageway by which the gas is flowed into contact with the substrate.

Another aspect of the invention provides a gas delivery apparatus for use in a substrate processing system. The gas delivery apparatus is disposed on a perimeter portion of a support member adapted to support a substrate on a surface thereof. A purge gas passageway is formed in the support member and couples a gas supply to an annular groove. At least a portion of a deflection member is disposed above the annular groove and includes a plurality of grooves or other gas deflection structures adapted to affect a desired flow of purge gas provided from the annular groove.

In another aspect of the invention, a purge gas assembly for directing the flow of a gas a processing system comprises a deflection member having a lower surface defining a deflection surface adapted to direct the flow of the gas at an angle to a radial line originating at a central axis of the deflection member; and an edge ring disposable over at least a portion of an upper surface of the deflection member and comprising an inner annular lip; wherein the deflection member and the edge ring define a portion of a purge gas passageway.

In yet another aspect of the invention, an apparatus for processing a substrate, comprises a support member having a substrate receiving surface and a shoulder portion of the support member disposed outwardly of the substrate receiving surface and having a gas delivery groove formed therein. A deflection member is positioned on the shoulder portion and an edge ring is at least partially disposed over the deflection member. The deflection member defines an interface between a surface of the deflection member and a surface of the shoulder portion. A deflection surface disposed at the interface is formed on at least one of the deflection member and the shoulder portion and is adapted to cause a tangential flow of gas flowing over the deflection surface. In one embodiment, exhaust ports formed in the edge ring are adapted to vent a space at least partially defined by the edge ring.

In still another aspect of the invention, a method for delivering a gas to a substrate supported on an upper surface of a support member in a process chamber is provided. In one embodiment, the method provides comprises providing a gas delivery assembly disposed on a shoulder of the support member, the gas delivery assembly comprises a deflection member and an edge ring having at least a portion disposed over the deflection member; flowing a gas into a gas delivery channel formed in the support member; flowing the gas over a deflection surface disposed on one or more of the deflection member and the shoulder to provide a tangential component to a direction of gas flow; and then flowing at least a portion of the gas into an annular opening formed between the gas delivery assembly and the edge ring.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 6 is a top view of a deflection member having angled grooves.

FIG. 7 is a partial top view taken along lines 7—7 in FIG. 6 showing the grooves of the deflection member.

DETAILED DESCRIPTION OF THE PREFERRED EMBODIMENT

The gas delivery apparatus is particularly useful in CVD processing chambers and the following description refers primarily to these CVD processes to facilitate description and understanding. However, it is to be understood that the gas delivery apparatus may have application to other processes, process chambers, and apparatuses, such as PVD and etching apparatuses, and is, therefore, not limited to the precise form described herein.

Figure 1:
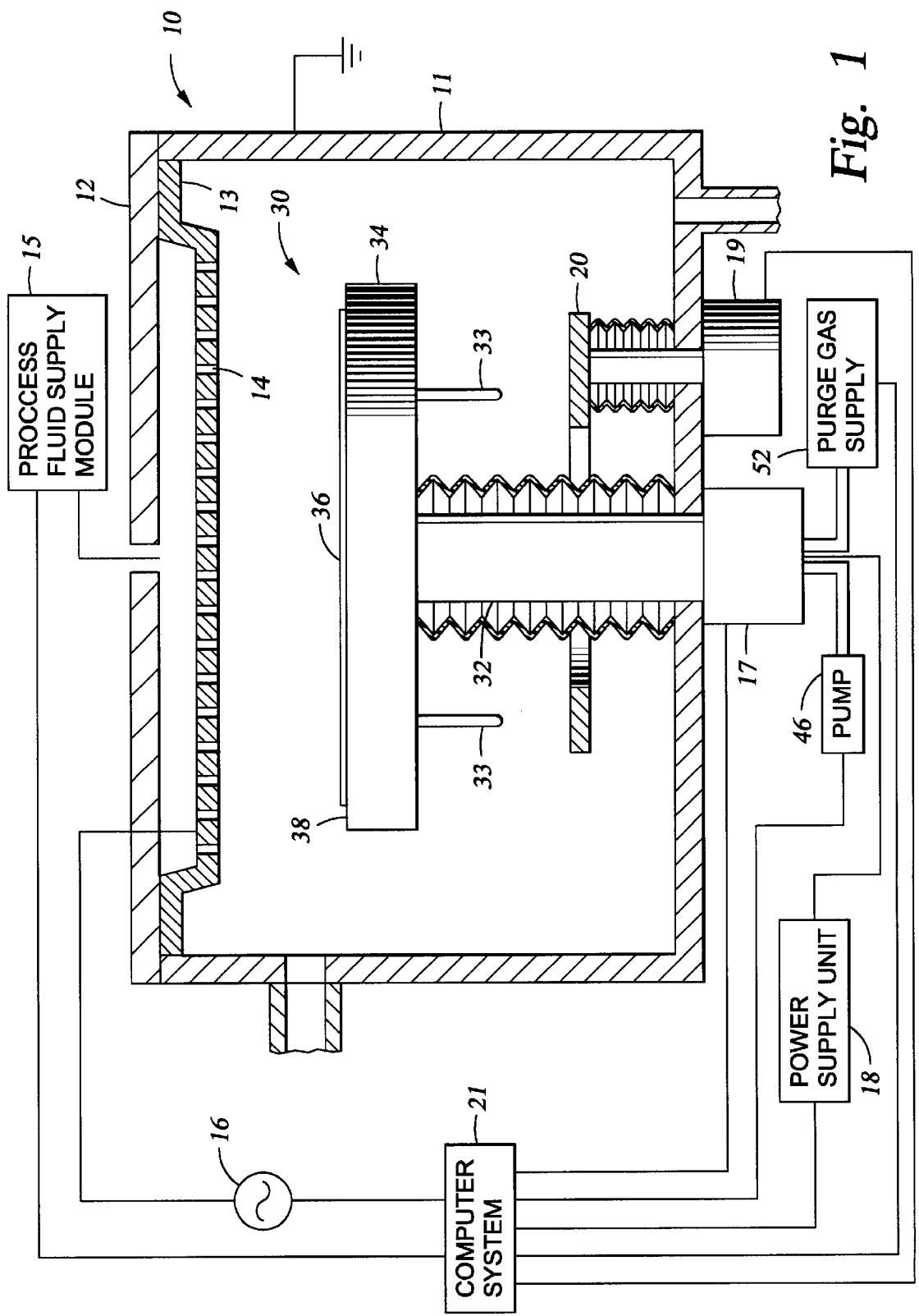
FIG. 1 is a schematic representation of a processing chamber 10.

FIG. 1 is a schematic representation of a processing chamber 10, illustratively a chemical vapor deposition chamber. The processing chamber 10 includes a body 11 and a lid 12 disposed at an upper end of the body 11. A showerhead 13 is disposed between the lid 12 and the body 11 and includes a plurality of ports 14 through which gases are flowed. The gases are supplied by a process fluid supply module 15 that contains a variety of inert and reactive gases according to the particular process being performed in the processing chamber 10. Some applications require a plasma to be maintained in the processing chamber 10. Accordingly, the showerhead 13 is coupled to a power supply assembly 16 which may include any combination of generators, transformers, matching circuits and other devices known in the art.

A substrate support member 30 is disposed in the processing chamber 10 and includes a stem 32 and a support plate 34 attached to an upper end of the stem 32. The support member 30 is vertically movable in the processing chamber 10 under the action of an actuator 17 connected to a lower end of the stem 32. The support plate 34 is adapted to support a substrate 36 on an upper surface 38. Vertically movable lift fingers 33 are disposed in the support plate 34 to assist in the positioning of the substrate 36 relative to the upper surface 38. Preferably, three equally spaced lift fingers 33 are positioned to contact the backside of the substrate 36 in order to lower or raise the substrate 36. Actuation of the lift fingers 33 may be accomplished, for example, by a motor 19 and an elevator plate 20.

Numerous peripheral devices are connected to the support member 30 as may be needed for different processes. Illustratively, a power supply 18, a pump 46 and a purge gas supply 52 are shown connected to the support member 30, each of which are described in more detail below.

Figure 2:
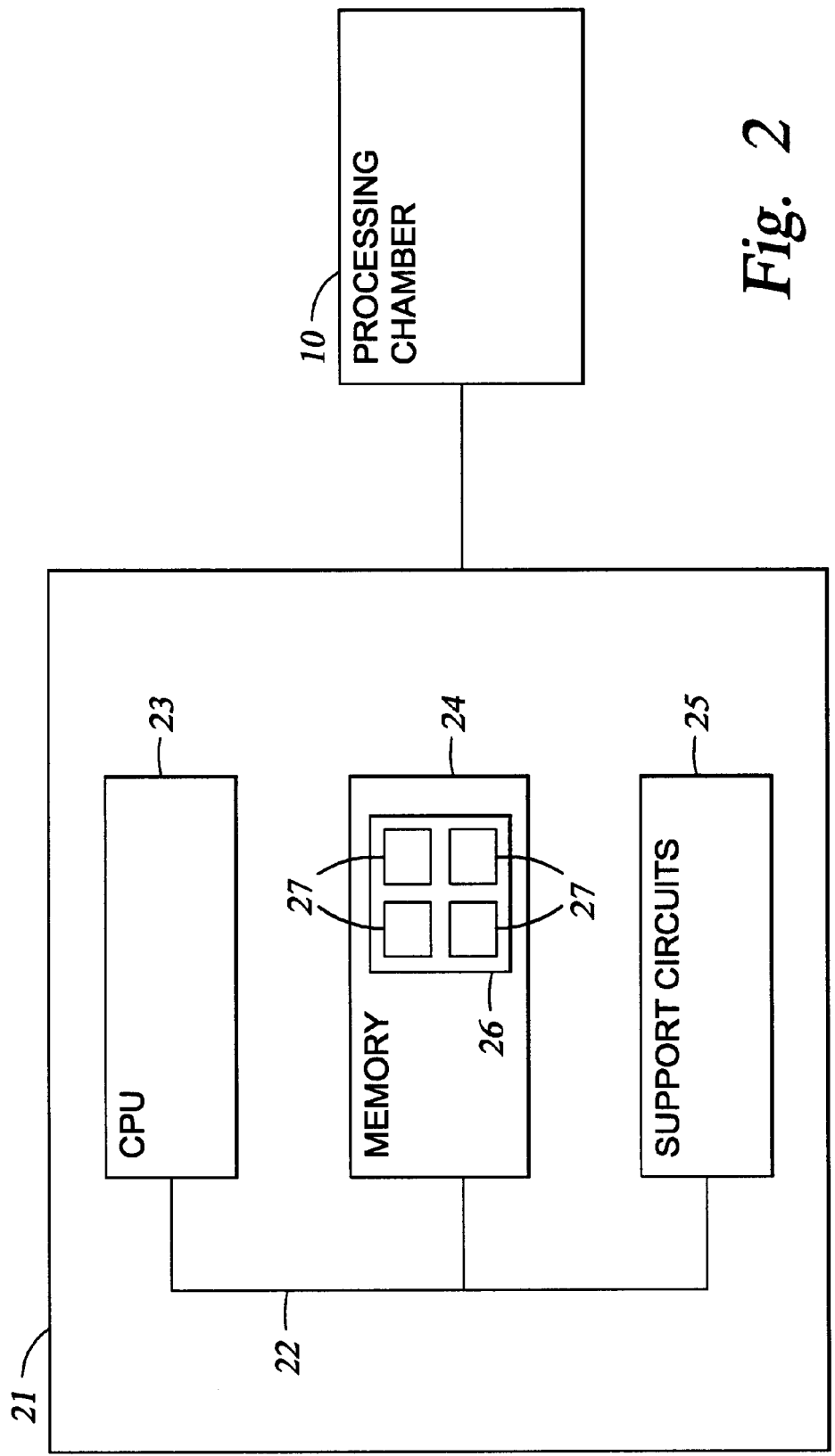
FIG. 2 is a schematic representation of a computer system.

The operation of the chamber 10 and the various related components are preferably controlled by a computer system 21. A schematic representation of the computer system 21 is shown in FIG. 2. The computer system 21 comprises a bus line 22 coupling a central processing unit (CPU) 23, a memory 24, and support circuits 25 for the CPU 23. The CPU 23 may be any general purpose computer processor that can be used in an industrial setting for controlling various chambers and subprocessors. The support circuits 25 are coupled to the CPU 23 for supporting the processor in a conventional manner. These circuits include cache, power supplies, clock circuits, input/output circuitry and subsystems, and the like. The memory 24, or computer-readable medium, is coupled to the CPU 23 and may be one or more of readily available memory such as random access memory (RAM), read only memory (ROM), floppy disk drive, hard disk, or any other form of digital storage, local or remote. While memory 24 is shown as a single entity, it should be understood that memory 24 may in fact comprise a plurality of modules, and that memory may exist at multiple levels, from high-speed registers and caches to lower speed but larger DRAM chips. A deposition process is generally stored in the memory 24, typically as a software routine 26. The software routine 26 may be loaded into the memory 24, as the computer system 21 has need for it, from a program product (i.e., signal bearing media). Illustrative program products include (i) information permanently stored on non-writable storage media (e.g., read-only memory devices within a computer such as CD-ROM disks readable by a CD-ROM drive); (ii) alterable information stored on writable storage media (e.g., floppy disks within diskette drive or hard-disk drive); or (iii) information conveyed to a computer by a communications medium, such as through a computer or telephone network, including wireless communications. The software routine 26 may also be stored and/or executed by a second CPU (not shown) that is remotely located from the hardware being controlled by the CPU 23. The software routine 26 includes multiple subroutines 27 each of which are adapted to perform the various operations described below.

Figure 3:
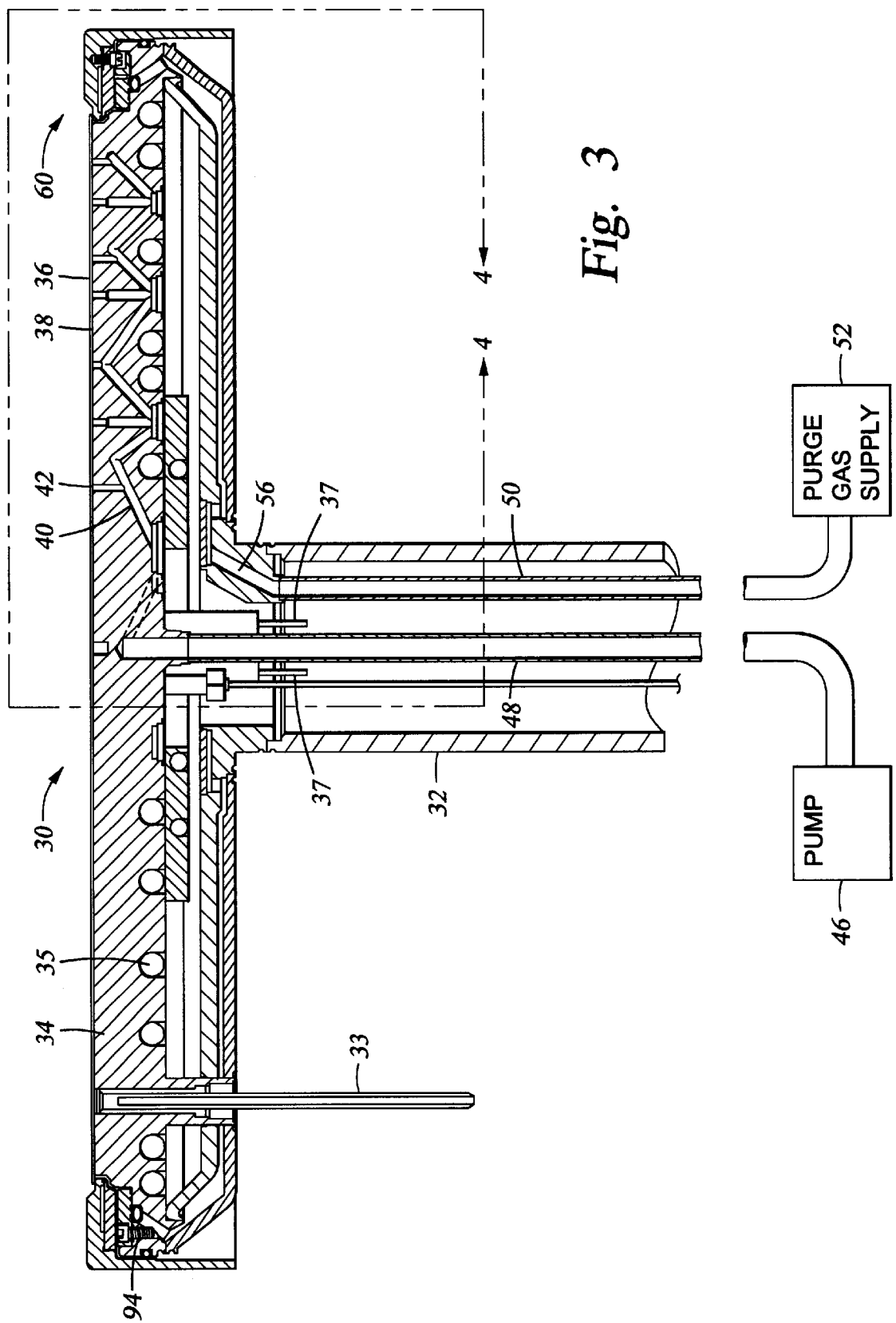
FIG. 3 is a cross-sectional side view of a support member having a gas delivery apparatus.

FIG. 3 is side cross-sectional view of the support member 30 illustrating additional details thereof. A multi-loop heating element 35 is embedded in the support plate 34 to ensure that the substrate 36 is maintained at the desired processing temperature. The heating element 35 may be one or more coils constructed of conventional materials such as a nichrome wire surrounded with an MgO insulation within a metal sheath. The metal sheath may be made of Incoloy®, Inconel®, stainless steel, or other metal capable of withstanding the high temperatures reached during casting/welding. Electrodes 37 at each end of the heating elements 35 may be coupled to the power supply 18 (shown in FIG. 1) which is adapted to energize the heating element 35 during processing. The heating element 35 is preferably in contact with the bulk of the support plate 34 on all sides in order to provide uniform heating of the support plate 34 and to uniformly heat the substrate 36 mounted thereon.

The particular heating element and configuration thereof may depend in part on the material of the support member 30 and, in particular, the support plate 34. In one embodiment, the support plate 34 is made of stainless steel to improve reliability and manufacturability. However, the support plate 34 may be formed of other materials such as ceramic and aluminum.

The support plate 34 is equipped with a vacuum system capable of chucking the substrate 36 to the support plate 34 to maintain good thermal contact between the support plate 34 and the substrate 36 during processing. A plurality of vacuum channels 40 are dispersed in the support plate and are coupled to a plurality of vacuum ports 42. The vacuum channels 40 are made up of a number of interconnected channel segments which extend laterally from a central portion of the support plate 34 to a perimeter portion of the support plate 34. The vacuum ports 42 are coupled to the vacuum channels 40 and extend vertically upward to the surface 38. Although not shown, the upper surface 38 may include grooves or recesses wherein a backside vacuum may be maintained between the surface 38 and the substrate 36. The vacuum is generated by the pump 46 which is coupled to the vacuum channels 40 by a vacuum tube 48, a portion of which extends through the stem 32.

The stem 32 also houses a purge gas tube 50 which is connected to a remotely located purge gas supply 52. The purge gas supply 52 provides a purge gas such as Argon to the tube 50. The tube 50 is coupled at an upper end to a purge gas inlet 56 formed in the support plate 34. The inlet 56 forms a segment of a gas flow path which extends through support plate 34 and delivers purge gas to a gas delivery assembly 60 positioned at a perimeter portion of the support plate 34.

Figure 4:
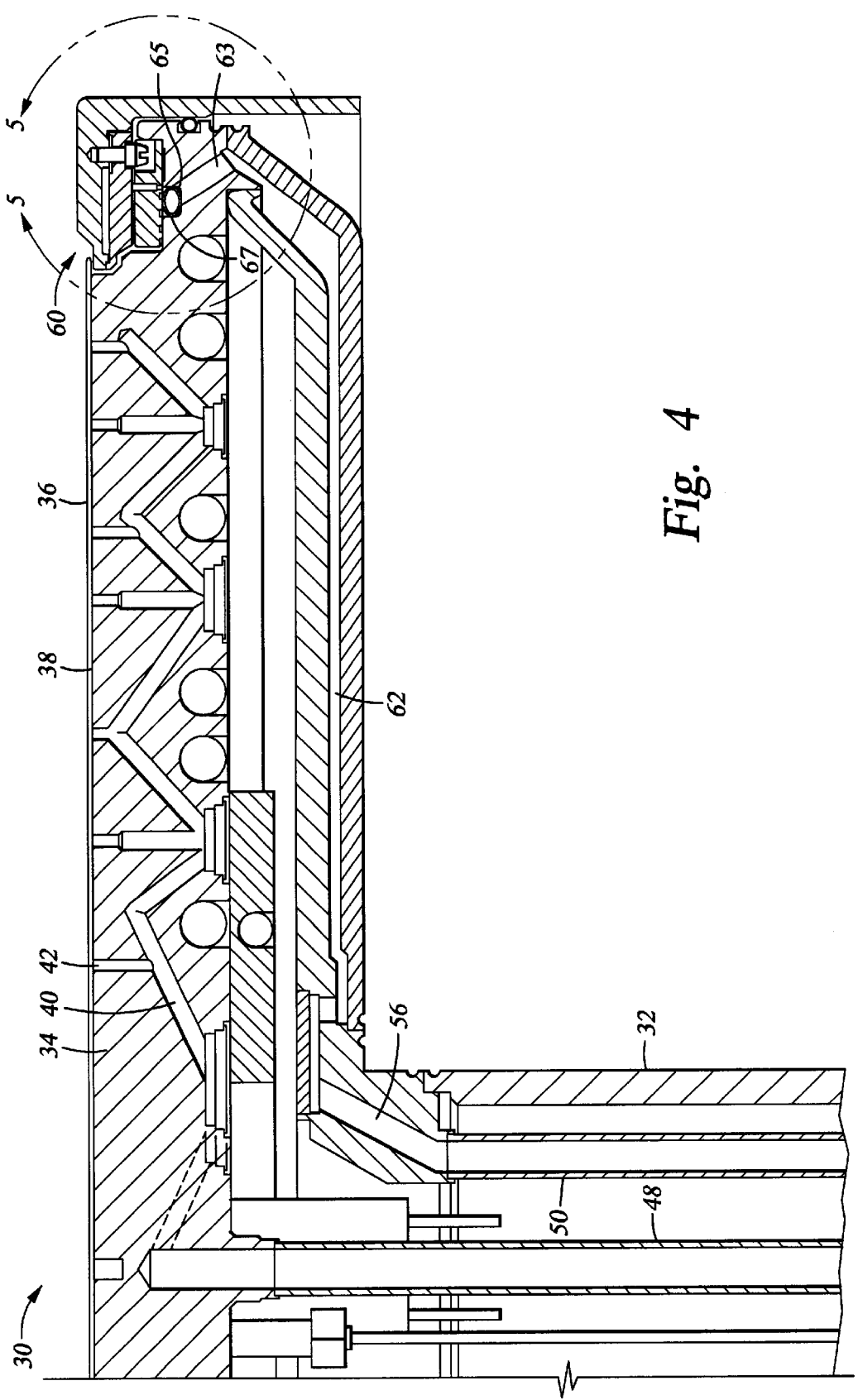
FIG. 4 is a cross-sectional side view of a support member having a gas delivery apparatus.

FIG. 4 shows a partial cross-section of the support plate 34 and the gas delivery assembly 60 taken along the section lines 4—4 of FIG. 3. A gas passageway 62 is formed near a lower face of the support plate 34 and extends generally radially from the purge gas inlet 56 outward to a perimeter portion of the support plate 34 to fluidly couple the purge gas inlet 56 to the gas delivery assembly 60. More particularly, the gas passageway 62 is connected to orifices 63 which in turn are connected to an annular groove 65 disposed below the gas delivery assembly 60. The orifices 63 are preferably equally spaced openings formed in the support plate 34. In one embodiment, twelve orifices are provided to couple the gas passageway 62 with the annular groove 65.

Optionally, the annular groove 65 has a coil 67 disposed therein. In one embodiment, the coil 67 is a spiral coil adapted to assist in uniformly delivering the purge gas to the edge of the substrate 36. Further, the coil 67 is manufactured of a metal to ensure that the gas delivery assembly 60 is adequately grounded to the support plate 34. Failure to ground the gas delivery assembly 60 can result in a charge build-up which may result in arcing. Arcing is undesirable because of the potential for damage to the substrate and chamber contamination. One example of a coil 67 that can be used to advantage is the Spira® gasket available from Spira Manufacturing Corporation in North Hollywood, California.

Figure 5:
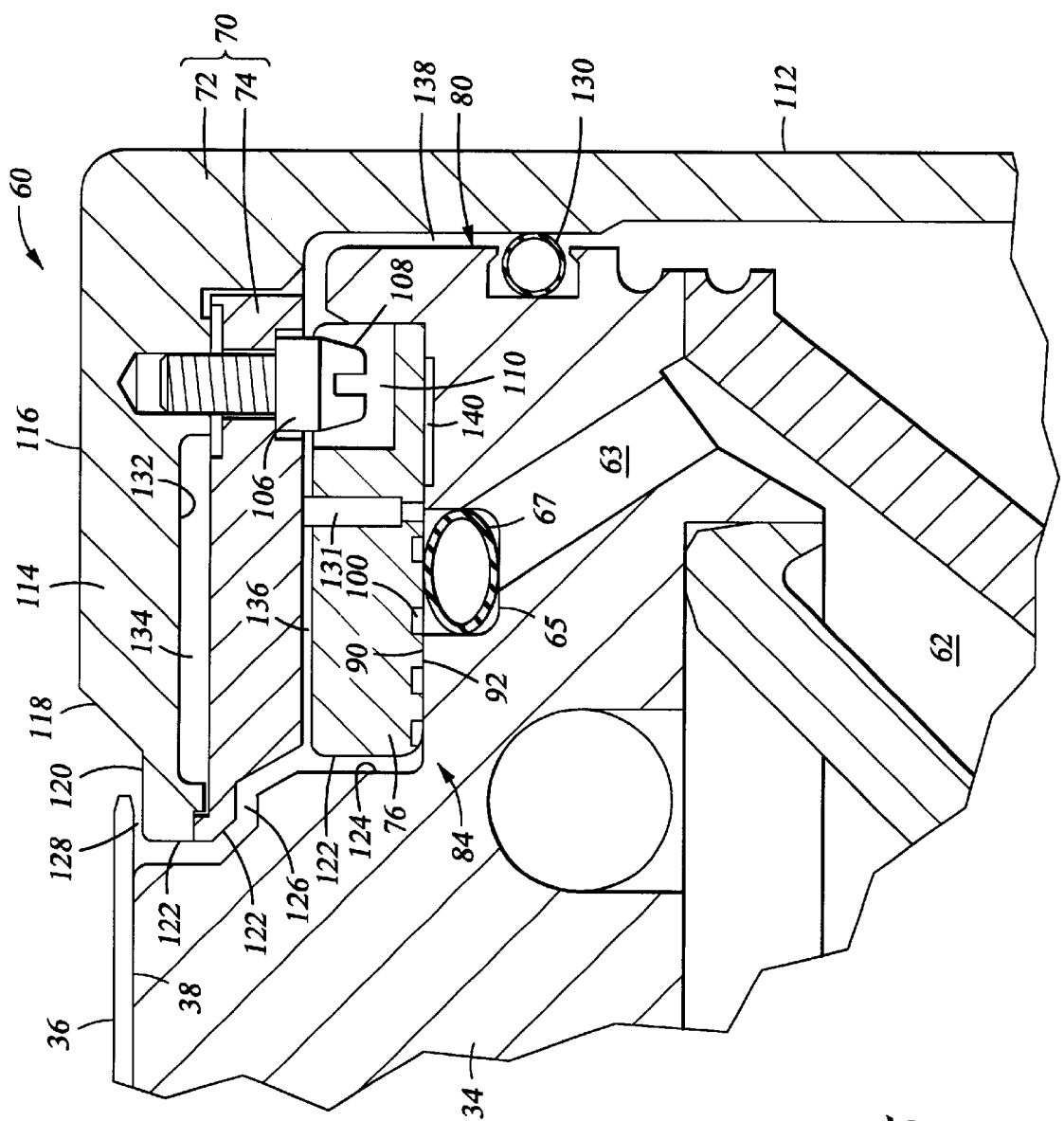
FIG. 5 is a cross-sectional side view of the support member of FIG. 4 taken along the section line 5—5.

FIG. 5 is a partial cross-section of the support plate 34 and the gas delivery assembly 60 taken along section line 5—5 of FIG. 4. The gas delivery assembly 60 generally comprises an edge ring 70 and a deflection member 76 which are disposed on a shoulder 80 of the support plate 34. The edge ring 70 and the deflection member 76 are annular components generally shaped according to the shape of the support plate 34. In the embodiments shown in FIGS. 3–5, the edge ring 70 and the deflection member 76 are ring-shaped. However, they could be rectangular, square or any other shape.

The deflection member 76 is seated in a recess 84 formed in the shoulder portion 80 of the support plate 34. The deflection member 76 includes a deflection surface 90, a portion of which is disposed on a floor 92 of the recess 84 and another portion of which forms an enclosure over the groove 65. The deflection member 76 is secured to the support plate 34 by screws 94 such as the one shown in FIG. 3. More generally, any fastener which facilitates easy removal of the deflection member 76 from the support plate 34 may be used.

FIG. 6 is a top view of the deflection member 76. The deflection member 76 is ring-shaped and defines a central opening 98, an outer mounting portion 99 and an inner grooved portion 101. The outer mounting portion 99 has holes 102 formed therein which are adapted to receive fasteners such as the screw 94 shown in FIG. 3. Additionally, the mounting portion 99 includes notches 110 (also shown in FIG. 5) to assist in aligning the edge ring 70 (FIG. 5) on the shoulder portion 80 (FIG. 5), as will be described below. The deflection surface 90 is formed on the diametrically inner portion 101 of the deflection member 76 and includes a plurality of grooves 100 formed thereon. A detailed illustration of the grooves 100 is provided in FIG. 7 which shows a partial top view of the deflection member 76. The grooves 100 are closely spaced from one another about the full circumference of the deflection member 76. In one embodiment, the grooves 100 are between about 120 and about 180 in number. In general, the number of grooves 100 is increased with the diameter of the deflection member 76. Preferably, the grooves 100 are equally spaced from one another to deliver gas uniformly therefrom. The grooves 100 are oriented at an angle θ to a radial line 104 originating at the center of the deflection member 76. The angle of the grooves 100 causes the purge gas flowing therethrough to flow at a velocity tangent to the radial line. The precise angle θ and the resulting angle of the flow may vary depending on the exact application and its variables, such as the gas flow rate. However, in one embodiment the angle θ of the grooves 100 relative the radial line 104 is between about 60 degrees and about 75 degrees. In a particular application, the angle of flow relative to the radial direction of the substrate 36 is about 75 degrees where the substrate 36 has a 300mm diameter.

In alternative embodiments, the grooves 100 may be formed by disposing fins, guides, such as walls, or other structures on the ring. The fins or guides can define the grooves which translate some angular or tangential component to the flow of the purge gas. The grooves 100 may be linear, parabolic, or otherwise shaped as long as they produce the desired angled flow.

Referring again to FIG. 5, the edge ring 70 is shown positioned on the shoulder 80 substantially covering the deflection member 76. In the preferred embodiment, the edge ring 70 comprises an upper edge ring 72 and a lower edge ring 74. The upper and lower edge rings 72, 74 may be coupled to one another by a plurality of screws 106 or similar fasteners which allow the rings 72, 74 to be easily coupled and uncoupled. In addition to coupling the upper and lower edge rings 72, 74, the screws 106 also facilitate alignment of the edge ring 70. Thus, a head 108 of the screw 106 is disposed in the notch 110 of the deflection member 76 to register the edge ring 70 and the deflection member 76 with one another.

In one embodiment, the edge ring 70 is not secured to any portion of the support plate 34 or deflection member 76, thereby facilitating its removal. The edge ring 70 is stabilized over the shoulder portion 80 under the pressure of its own weight and by friction contacts with various points. As shown in FIG. 5, the lower edge ring 74 is supported at the upper end of a pin 131 disposed through the deflection member 76. Additionally, a gasket 130 disposed about the perimeter of the shoulder portion 80 provides another contact point with an annular skirt 112 of the upper edge ring 72. The gasket 130 is preferably a metal member that provides electrical contact between the upper edge ring 72 and the support plate 34 to allow charges to drain from the upper edge ring 72. In one embodiment, the gasket 130 is the Spira® gasket available from Spira Manufacturing located in North Hollywood, California.

The upper edge ring 72 includes an annular skirt 112 and a top portion 114. The skirt 112 is vertically disposed along the shoulder 80 of the support plate 34 and operates as a shield preventing gases from depositing on the surfaces of the support plate 34. The top portion 114 extends radially inwardly at an angle substantially perpendicular to the skirt 112. The top portion 114 includes an upper surface 116 positioned at a distance above the upper surface 38 of the support plate 34 and a substrate supported thereon. A sloped surface 118 is provided diametrically inwardly of the upper surface 116 and terminates at a lip 120. The upper surface of the lip 120 is positioned on a plane slightly below the upper surface 38 of the support member 30. In addition, the lip 120 extends radially inwardly from the outer edge of the substrate 36. In operation, the outer edge of the substrate 36 is positioned over at least a portion of the lip 120 to form a space 128 therebetween. The height of the space 128 can be adjusted to affect the velocity of purge gas flowing through the space 128. In general, as the space 128 is reduced, the velocity of the gas increases while the pressure in the space 128 decreases.

The upper edge ring 72, the lower edge ring 74 and the deflection member 76 cooperate to form an outer surface 122 which is disposed in spaced facing relation to a wall 124 of the support plate 34. Accordingly, an annular purge gas opening 126 is formed between the wall 124 and the outer surface 122. The annular purge gas opening 126 terminates at the lip 120 and at a point slightly below the substrate 36. In one embodiment, the annular purge gas opening 126 can be continuous about 360 degrees. Thus, the flow of gas out of the annular purge gas opening 126 is not affected by structures or formations disposed in the annular purge gas opening 126.

The edge ring 70 preferably has minimal contact with the support plate 34 and other components. In order to control the temperature of the purge gas delivery assembly 60, a number of thermal chokes are provided between the upper edge ring 72, the lower edge ring 74, the deflection member 76 and the support plate 34. For example, the lower edge ring 74 is supported above the deflection member 76 on pins 131 to define a gap 136 therebetween. Additionally, the upper edge ring is disposed on the lower edge ring and contacts the lower edge ring at the edges thereof. A recess 132 is formed in the lower surface of the top portion 114 of the upper edge ring 72. The recess 132 forms an annular space 134 between the upper and lower edge rings 72, 74. As shown in FIG. 5, spaces 136, 138 are provided between the lower edge ring 74 and the deflection member 76 and between the skirt 112 and the outer surface of the shoulder 80, respectively. Additionally, a space 140 is provided between the deflection member 76 and the shoulder 80. The spaces 134, 136, 138 and 140 minimize thermal conduction between the various components.

As a result of its proximity and contact with the support plate 34, the deflection member 76 will typically be maintained at a relatively higher temperature than the upper and lower edge rings 72, 74. Conversely, the upper edge ring 72 will be maintained at a relatively lower temperature than the lower edge ring 74 and the deflection member 76. As a result, a decreasing temperature gradient is maintained from the deflection member 76 to the upper edge ring 72. In a typical TiN deposition process, for example, the upper edge ring 72 is preferably maintained at a temperature of between about 100° C. and about 120° C. lower than the support plate 34. The resulting temperature gradient reduces the amount of deposition on areas where deposition is not wanted. Deposition is generally related to the temperature of the surface being deposited on, with higher temperatures typically providing for more deposition. Thus, the deposition is expected to be relatively less on the relatively cooler areas of the support member 30.

In operation, a substrate is positioned on the upper surface 38 of the support member 30 for processing. The positioning of the substrate can be done using a conventional robot (not shown). While carrying the substrate, the robot is moved to a position over the upper surface 38. The lift fingers 33 are then raised to lift the substrate from the robot. After retracting the robot, a motion actuator connected to the support member 30 moves the support member 30 vertically upward past the top of the lift fingers 33 to lift the substrate 36 from the lifting fingers 33, thereby leaving the substrate 36 on the upper surface 38. Performing these steps in reverse order operates to complete a transfer of the substrate 36 from the support member 30 to the robot.

Often, during positioning, the substrate 36 is misaligned relative to the support member 30. To correct the misalignment and help ensure proper deposition, an alignment apparatus can be used to align the substrate 36 on the support member 30. The particular method or device used for alignment is not limiting of the invention and may include any combination of known and unknown techniques. In one embodiment, the sloped surface 118 is adapted to assist in aligning the substrate. The sloped surface 118 is an annular surface having a relatively large diameter at an upper end and a relatively smaller diameter at a lower end, resulting in an inwardly tapered surface. Thus, as the substrate is lowered onto the surface 38 of the support plate 34, the contact with the sloped surface 118 urges the substrate into a central position relative to the plate 34.

Once the substrate 36 is positioned and aligned on the support member 30, the support member is raised into a processing position and a deposition sequence is initiated. The deposition sequence involves flowing gases into a region near the upper surface of the substrate 36. The gases are allowed to contact the substrate 36 and react thereon to form a film.

In order to prevent unwanted deposition on the edge and backside of the substrate, a purge gas, such as argon, is provided to the edge of the substrate 36. The purge gas is provided by the purge gas supply 52 and flowed to the orifices 63 via the tube 50, the inlet 56 and the gas passageway 62. The purge gas is delivered from the orifices 63 into the annular groove 65. The annular groove 65 allows some degree of uniform distribution of the purge gas below the deflect plate 76 prior to flowing into the annular gas opening 126. Optionally, the coil 67 is provided to further ensure the uniformity of gas delivery. The coil 67 may include spacing which allows the gas to flow into a central annular cavity of the coil 67. A portion of the gas is flowed annularly into the cavity of the coil 67 where it is uniformly distributed and then out of the coil 67.

From the annular groove 65, the purge gas is flowed over the deflection surface 90 of the deflection member 76. The angled orientation of the grooves 100 formed in the deflection surface 90 redirects incoming gas to flow at an angle relative to the radial line 104 (shown in FIGS. 6–7) of the deflection member 76. Accordingly, the flow of the gas is given a tangential component. The gas then flows upward between the wall 124 and the outer surface 122, i.e., through the annular opening 126. The annular opening 126 is continuous about 360 degrees so that the flow of gas may be delivered about the full periphery of the substrate 36, thereby inhibiting the process gas from coming in contact with the back side and edge of the substrate 36 and depositing material thereon. Upon reaching the lower surface of the substrate 36, the gas flows through the space 128 and over the sloped surface 118. The sloped surface 118 is adapted to flow the purge gas upward and radially outward relative to the edge of the substrate 36, thereby flowing materials captured in the stream of flow away from the substrate 36.

As a result of the grooves 100, it is believed the purge gas forms a protective tornadic wall of gas around the edge of the substrate 36. When viewed as a combination of the flow from all of the grooves 100 spaced about the circumference of the deflection member 76, the grooves 100 create a wall of purge gas around the periphery of the substrate 36. Thus, the invention ensures a more uniform purge gas flow about the periphery of the substrate and reduces the effects of pressure differentials, thereby achieving a higher degree of deposition uniformity on the substrate.

Figure 8:
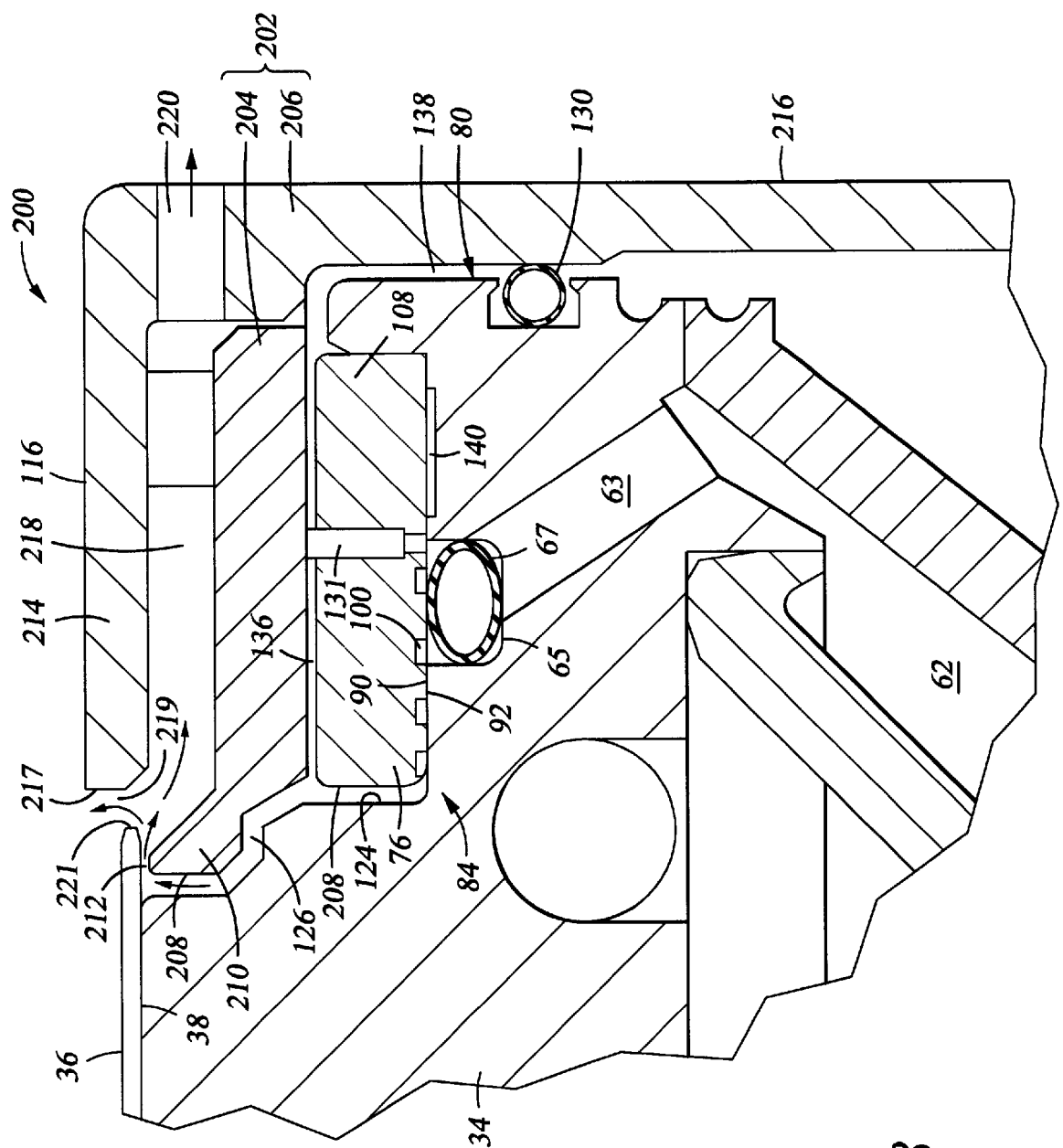
FIG. 8 is a cross-sectional side view of an alternate embodiment of a gas delivery apparatus.

Another embodiment of a gas delivery assembly 200 is shown in FIG. 8. For simplicity, common components have been commonly numbered. The gas delivery assembly 200 generally comprises an edge ring assembly 202 and the deflection member 76 disposed on the support plate 34. The edge ring assembly 202 comprises a lower edge ring 204 and an upper edge ring 206 which are preferably separate components coupled by bolts or similar fasteners.

The lower edge ring 204 is disposed over the deflection member 76 and is supported by the pin 131. Together, the lower edge ring 204 and the deflection member 76 define an outer surface 208. The outer surface 208 is spaced away from the wall 124 of the support plate 34 to define the annular purge gas opening 126. A portion of the outer surface 208 is defined by a lip 210 disposed at the inner diameter of the lower edge ring 204 and positionable below a perimeter portion of the substrate 36. The upper end of the lip 210 and the lower surface of the substrate 36 define a gap 212 through which gas flows during processing. In one embodiment, the gap 212 is between about 0.010 inches and about 0.025 inches.

The upper edge ring 206 is L-shaped and has a top portion 214 extending radially outwardly over the lower edge ring 204 and an annular skirt 216 of the upper edge ring 206 surrounding the support plate 34. The top portion 214 overhangs the lower edge ring 204 in spaced relation therewith to define an annular space 218. Ports 220 are formed in the upper edge ring 206 and are in fluid communication with the gap 218. The ports 220 may be equally spaced about the upper edge ring 206 to vent the gap 212. The area occupied by the ports 220 may be related to the total area of the annular skirt 216 exposed to the gap 218. In one embodiment, the area of the ports 220 is between about 50% and about 80% of the total area where the circumference of the annular skirt 216 is C and the height of the gap 218 is D, the total exposed area is C×D=$A_{CD}$. Another gap 219 is defined by a diametrically inner surface 217 of the top portion 214 and an edge 221 of the substrate 36. In one embodiment, the width of the gap 219 is between about 0.010 inches and about 0.030 inches.

In operation, a gas is flowed through the gas passageway 62, orifices 63, annular groove 65, grooves 100 and into the annular purge gas opening 126 in the manner described above with reference to FIGS. 3–7. The flow pattern of the gas from the annular purge gas opening 126 is shown by arrows. The gas first flows through the gap 212. A portion of the gas then flows through the gap 219 between the edge 221 of the substrate 36 and the diametrically inner surface 217 of the upper edge ring 206. Another portion of the gas flows through the annular space 218 and then through the ports 220. Accordingly, the gas delivery assembly 200 directs the gas along at least two separate flow paths once the gas is flowed through the gap 212. This embodiment reduces the volume of gas flowing into a region near the upper surface of the substrate 36, i.e., the surface being processed. Thus, the interference with deposition of material onto the upper surface of the substrate 36 is reduced while a sufficient volume of gas is still flowed through the gap 212 to prevent deposition onto the backside and edge of the substrate 36.

While the foregoing is directed to the preferred embodiments of the present invention, other and further embodiments of the invention may be devised without departing from the basic thereof, and scope thereof is determined by the claims which follow.

What is claimed is:

1. A purge gas assembly adapted to direct a flow of a gas in a processing system, comprising:

a deflection member having a lower surface defining a deflection surface adapted to direct the flow of the gas at an angle to a radial line directed from a central axis of the deflection member over the deflection surface; and an edge ring disposable over at least a portion of an upper surface of the deflection member and comprising an inner annular lip;

wherein the deflection member and the edge ring define a portion of a purge gas passageway.

2. The apparatus of claim 1, wherein a diametrically interior portion of the annular lip is disposable below a perimeter portion of a substrate disposed on a substrate receiving surface of a support member defining another portion of the purge gas passageway.

3. The apparatus of claim 1, wherein the edge ring comprises a first portion and a second portion coupled to one another.

4. The apparatus of claim 1, wherein the edge ring defines a plurality of purge gas exhaust ports extending substantially radially outwardly relative to a central axis of the edge ring.

5. The apparatus of claim 1, wherein the edge ring comprises:
   a first portion having a sloped surface disposed between a top surface and the annular lip; and
   a second portion coupled to a lower surface of the first portion and disposed in facing relation to the deflection member.

6. The apparatus of claim 5, wherein the lower surface of the first portion and an upper surface of the second portion define one or more spaces therebetween.

7. The apparatus of claim 5, wherein the first portion and the second portion of the edge ring are coupled by fasteners.

8. The apparatus of claim 1, wherein the deflection surface comprises one or more of fluid grooves formed at least partially therein.

9. The apparatus of claim 8, wherein the one or more grooves extend outwardly from an inner diameter of the deflection member at an angle to a radial line originating at a center axis of the deflection member.

10. The apparatus of claim 9, wherein the angle is between about 60 and 75 degrees.

11. The apparatus of claim 1, wherein the edge ring comprises an annular upper portion which forms a portion of a purge gas exhaust passageway and wherein the edge ring further comprises ports to vent the purge gas exhaust passageway.

12. The apparatus of claim 11, wherein a diametrically interior portion of the annular lip is disposable at a height substantially equal to the edge of the substrate.

13. An apparatus for processing a substrate, comprising:
   a support member having a substrate receiving surface;
   a shoulder portion of the support member disposed outwardly of the substrate receiving surface and having a gas delivery groove formed therein;
   a deflection member positioned on the shoulder portion to define an interface between a surface of the deflection member and a surface of the shoulder portion;
   a deflection surface disposed at the interface and formed on at least one of the deflection member and the shoulder portion and wherein the deflection surface is adapted to cause a tangential flow of gas over the deflection surface; and
   an edge ring at least partially disposed over the deflection member.

14. The apparatus of claim 13, wherein the edge ring comprises a first portion and a second portion coupled to a lower surface of the first portion.

15. The apparatus of claim 13, further comprising a purge gas supply fluidly coupled to the gas groove.

16. The apparatus of claim 13, wherein the deflection member defines one or more grooves in the deflection surface extending outwardly from an inner diameter surface of the deflection member at an angle to a radius of the deflection member.

17. The apparatus of claim 13, wherein the angle is between about 60 and 75 degrees.

18. The apparatus of claim 13, wherein the edge ring defines a plurality of purge gas exhaust ports extending substantially radially outwardly relative to the substrate receiving surface.

19. The apparatus of claim 13, wherein the edge ring comprises an upper portion and a lower portion forming a purge gas passageway therebetween and wherein at least one of the upper portion and lower portion define exhaust ports to vent the purge gas passageway.

20. The apparatus of claim 19, wherein the first portion and the second portion are coupled to one another by fasteners.

21. A method for delivering a gas to a substrate supported on an upper surface of a support member in a process chamber, comprising:
   a) providing a gas delivery assembly disposed on a shoulder of the support member, the gas delivery assembly comprises a deflection member and an edge ring having at least a portion disposed over the deflection member;
   b) flowing a gas into a gas delivery channel formed in the support member;
   c) flowing the gas over a deflection surface disposed on one or more of the deflection member and the shoulder to provide a tangential component to a direction of gas flow; and then
   d) flowing at least a portion of the gas into an annular opening formed between the gas delivery assembly and the shoulder of the support member.

22. The method of claim 21, further comprising flowing a portion of the gas through one or more ports defined in the edge ring.

23. The method of claim 21, further comprising flowing a first portion of the gas through one or more ports defined in the edge ring and a flowing a second portion of the gas in a space formed between a lip of the edge ring and an outer edge of the substrate.

24. The method of claim 21, wherein the gas is directed at an angle between about 60 degrees and about 75 degrees to a radius of the deflection member.

25. The method of claim 21, wherein c) comprises flowing the gas through one or more grooves defined by the deflection surface.

26. The method of claim 21, wherein c) comprises flowing the gas through one or more grooves defined by the deflection surface, wherein the deflection surface is disposed on a surface of the deflection member in facing relation to a surface of the shoulder.

27. The method of claim 21, wherein c) comprises flowing the gas through one or more grooves defined by the deflection surface, wherein the deflection surface is disposed on a surface of the shoulder in facing relation to a surface of the deflection member.

28. The method of claim 21, further comprising flowing the gas unto a perimeter portion of the substrate.

* * * * *

UNITED STATES PATENT AND TRADEMARK OFFICE
CERTIFICATE OF CORRECTION

PATENT NO.    : 6,350,320 B1
DATED         : February 26, 2002
INVENTOR(S)   : Semyon Sherstinsky et al.

It is certified that error appears in the above-identified patent and that said Letters Patent is hereby corrected as shown below:

<u>Column 10,</u>
Line 48, please change "basic thereof," to -- basic scope thereof, --.

Signed and Sealed this

Twelfth Day of November, 2002

Attest:

Attesting Officer

JAMES E. ROGAN
*Director of the United States Patent and Trademark Office*